(12) United States Patent
Narayanan et al.

(10) Patent No.: US 7,122,733 B2
(45) Date of Patent: Oct. 17, 2006

(54) MULTI-JUNCTION PHOTOVOLTAIC CELL HAVING BUFFER LAYERS FOR THE GROWTH OF SINGLE CRYSTAL BORON COMPOUNDS

(75) Inventors: Authi A. Narayanan, Thousand Oaks, CA (US); Joel A. Schwartz, Glendale, CA (US)

(73) Assignee: The Boeing Company, Chicago, IL (US)

( * ) Notice: Subject to any disclaimer, the term of this patent is extended or adjusted under 35 U.S.C. 154(b) by 655 days.

(21) Appl. No.: 10/236,797

(22) Filed: Sep. 6, 2002

(65) Prior Publication Data

US 2004/0045598 A1 Mar. 11, 2004

(51) Int. Cl.
*H01L 31/04* (2006.01)
*H01L 31/06* (2006.01)

(52) U.S. Cl. .................. 136/249; 136/255; 136/252; 136/262; 257/461; 257/431; 257/464; 244/172.7

(58) Field of Classification Search ............... 136/249, 136/255, 252, 262; 257/461, 431, 464; 244/172.7
See application file for complete search history.

(56) References Cited

U.S. PATENT DOCUMENTS

| | | | |
|---|---|---|---|
| 5,223,043 A | 6/1993 | Olson et al. | |
| 5,275,687 A * | 1/1994 | Choquette et al. | 117/98 |
| 5,853,497 A | 12/1998 | Lillington et al. | |
| 5,944,913 A | 8/1999 | Hou et al. | |
| 6,281,426 B1 * | 8/2001 | Olson et al. | 136/249 |
| 6,340,788 B1 * | 1/2002 | King et al. | 136/261 |
| 6,512,171 B1 * | 1/2003 | Inamasu et al. | 136/258 |
| 6,660,928 B1 * | 12/2003 | Patton et al. | 136/249 |
| 6,921,726 B1 * | 7/2005 | Akiyama et al. | 438/767 |
| 2003/0070707 A1 * | 4/2003 | King et al. | 136/255 |
| 2003/0173559 A1 * | 9/2003 | Akiyama et al. | 257/14 |
| 2004/0065363 A1 * | 4/2004 | Fetzer et al. | 136/262 |
| 2004/0079408 A1 * | 4/2004 | Fetzer et al. | 136/262 |
| 2004/0200523 A1 * | 10/2004 | King et al. | 136/262 |
| 2004/0261837 A1 * | 12/2004 | Friedman et al. | 136/249 |

OTHER PUBLICATIONS

Takamoto et al, "InGaP/GaAs and InGaAs Mechanically-Stacked Triple-Junction Solar Cells," 26th PVSC, Sep. 30 to Oct. 3, 1997, pp. 1031-1034.*
Geisz et al, "BGaInAs Solar Cells Lattice-Matched to GaAs," Conference Record of the Twenty-Eighth IEEE Photovoltaic Specialists Conference, Sep. 15-22, 2000, pp. 990-993.*
Song et al, "Occurance of CuPt-a and CuPt-B Type Ordering in GaInP Layers Grown by Solid Source Molecular Beam Epitaxy," Applied Surface Science, vol. 183, (2001), pp. 33-38, (month unknown).*
Geisz, J.F. et al., *BGaInAs Alloys lattice matched to GaAs*, Applied Phy. Lett., vol. 76, No. 11, p. 1443, Mar. 13, 2000.
Chiang et al., *Large Area GaInP$_2$/GaAs/Ge Multijunction Solar Cell for Space Applications*, First WPEC, Hawaii, Dec. 5-9, 1994, p. 2120-2123.

* cited by examiner

*Primary Examiner*—Alan Diamond
(74) *Attorney, Agent, or Firm*—Ingrassia Fisher & Lorenz, P.C.

(57) ABSTRACT

The present invention provides a solar cell comprising a substrate, a first buffer layer disposed above the base layer, a second buffer layer disposed above the first buffer layer, a first boron compound layer disposed above the second buffer layer, a second boron compound layer disposed above the first compound layer, and a window layer disposed above the second compound layer, wherein the first compound layer comprises a first type of doping, wherein the second compound layer comprises a second type of doping, wherein the second buffer layer comprises a higher energy bandgap than the first compound layer, and wherein the first buffer layer and the second buffer layer permit a boron content in the first compound layer and the second compound layer to be greater than 3 %.

38 Claims, 6 Drawing Sheets

MULTI-JUNCTION PHOTOVOLTAIC CELL HAVING BUFFER LAYERS FOR THE GROWTH OF SINGLE CRYSTAL BORON COMPOUNDS

BACKGROUND OF THE INVENTION

The present invention generally relates to photovoltaic cells and, more specifically, to an enhanced multi-junction photovoltaic cell that includes buffer layers for the growth of single crystal boron compounds.

The interest in photovoltaic (PV) cells or solar cells has been increasing due to concerns regarding pollution and limited available resources. This interest includes both terrestrial and non-terrestrial applications. In the non-terrestrial environment of outer space, the concern over limited resources of any type is a major one because the need to increase an amount of a resource increases a spacecraft's payload. An increased payload can increase the cost of a launch more than linearly. With the ready availability of solar energy in outer space for a spacecraft, such as a satellite, the efficient conversion of solar energy into electrical energy is an obvious alternative to an increased payload.

The cost per watt of electrical power generation capacity of photovoltaic systems is a main factor that inhibits their widespread use in terrestrial applications. Conversion efficiency of sunlight to electricity is of critical importance for terrestrial PV systems, since increased efficiency usually results in a reduction of related electricity generation system components (such as, cell area, module or collector area, support structures, and land area) for a given required power output of the system. For example, in concentrator photovoltaic systems which concentrate sunlight from around 2 to around 2000 times onto the PV cell, an increase in efficiency typically results in a proportionate reduction of an area comprising expensive concentrating optics.

Irrespective of the application, and as with any energy generation system, efforts have been ongoing to increase the output and efficiency of PV cells. In terms of output, multiple cells or layers having different energy bandgaps have been stacked so that each cell or layer can absorb a different part of the wide energy distribution of photons in sunlight. The stacked arrangement has been provided in a monolithic structure on a single substrate or on multiple substrates.

In a multiple cell device, semiconductive materials are typically lattice-matched to form multiple p-n (or n-p) junctions. The p-n (or n-p) junctions can be of the homo-junction or heterojunction type. When solar energy is received at a junction, minority carriers (i.e., electrons and holes) are generated in the conduction and valence bands of the semiconductor materials adjacent the junction. A voltage is thereby created across the junction and a current can be utilized there from. As the solar energy passes to the next junction, which can be optimized to a lower energy range, additional solar energy at this lower energy range can be converted into a useful current. With a greater number of junctions, there can be greater conversion efficiency and increased output voltage.

Whether in the multiple-junction or single-junction PV device, a conventional characteristic of PV cells has been the use of a single window layer disposed on an emitter layer which is disposed on a base layer. Further, the base layer may be disposed on a back surface field layer which is disposed on a substrate. The window layer and the back surface field layers are of higher bandgap semiconducting material lattice matched to the whole structure. The purpose of the top window layer and the back-surface field layer have been to serve both as a passivation layer and a reflection layer due to high electric fields associated with the high bandgap. The photo-generated carriers, such as the electrons in the emitter layer and the holes in the base layer, can further be reflected towards the p-n junction (which is the emitter and the base layer interface), for recombination and for generating electricity.

For a multiple-cell PV device, efficiency is limited by the requirement of low resistance interfaces between the individual cells to enable the generated current to flow from one cell to the next. Accordingly, in a monolithic structure, tunnel junctions have been used to minimize the blockage of current flow. In a multiple wafer structure, front and back metallization grids or contacts with low coverage fraction and transparent conductors have been used for low resistance connectivity. Since the output power is the product of voltage and current, a multi-junction solar cell can be designed with multiple junctions comprised of materials having different bandgaps, so that each junction can absorb a different part of the wide energy distribution of photons in sunlight. Additionally, uniform current generating characteristics may be produced.

Materials for a solar cell are conventionally grown epitaxially in a metal organic vapor phase epitaxy (MOVPE) system, also known as a metal organic chemical vapor deposition (MOCVD) system. During material growth, the lattice parameter for all of the different cell layers comprising the solar cell should be the same as that of the substrate. III–V compound materials of different compositions, but with the same lattice parameter as that of the substrate, are used to achieve different bandgaps that are typically required for multijunction solar cells. These layers are usually grown on a III–V substrate such as a GaAs wafer. In order to reduce the cost of the substrate material as well as to increase the over all power to weight ratio from the solar cell, a GaAs nucleated Ge substrate can be used. The lattice parameter of the Ge substrate is about 5.64613 Angstroms (Å) and that of GaAs is about 5.6533 Å with little mismatch between the lattice parameters. Although the Ge atomic structure is of a diamond structure pattern and that of GaAs is of a zinc-blend structure, it can be possible to grow GaAs on Ge with minimum defects. For a multijunction solar cell device, a thin layer of GaAs is first grown on the Ge substrate and followed by the growth of various other compositions.

Existing III–V semiconductor multi-junction solar cells are processed from epitaxial gallium indium phosphide/gallium arsenide ($GaInP_2$/GaAs) materials, grown on a GaAs nucleated Ge substrate. By providing active junctions in $GaInP_2$, GaAs, and Ge, a triple-junction solar cell can be processed. These existing triple-junction solar cells have demonstrated a 29.3% efficiency under space solar spectrum that is Air Mass 0 (AM0), 0.1353 $W/cm^2$ at 28° C. Under the concentrator terrestrial spectrum (AM1.5D, 44$W/cm^2$, 25° C.), an efficiency of 32.3% has also been demonstrated. The Air Mass value indicates the amount of air in space while the conversion efficiency describes a percentage of conversion from the sun's energy to electrical power. A limitation of such triple-junction solar cells includes the inability of increasing the AM0 efficiency above 29.3% (to, for example, 35% or higher). To achieve such an increase, four junctions may be needed to enhance the utilization of the sun's energy spectrum.

Conventional methods to grow a triple-junction solar cell typically use $GaInP_2$, GaAs and Ge cells. The direct bandgaps of $GaInP_2$ and GaAs are about 1.85 eV and about 1.424 eV respectively (Ge has an indirect bandgap of about 0.66 eV). Theoretical studies have shown that an additional third junction of about a 1.0 eV solar cell disposed on top of the Ge junction may be necessary for building a four junction monolithic solar cell. As such, GaInP$_2$ may form the first junction, GaAs can form the second junction, a new 1 eV material may form the third junction and Ge can form the fourth junction. Limitations of such materials include a lack of a bandgap around 1.0 eV that may be lattice matched to Ge and a lack of requisite material properties needed to process a solar cell. Some materials such as Gallium Indium Arsenic Nitride (GaInAsN) have been used in an attempt to achieve lattice-matching characteristics, however an ability to produce material with requisite characteristics and with a bandgap around 1.0 eV has not been achieved.

Using boron compounds may allow the formation of a junction material having a bandgap of about 1.0 eV in a multi-junction solar cell thus resulting in a higher voltage output. Prior art methods to grow epitaxial single crystal boron compounds, such as those from National Renewable Energy Laboratories (NREL), have followed conventional MOCVD growth techniques to achieve a low boron content of about 1.6% and could not demonstrate lattice matched boron based materials (such as BGaInAs) with high boron content due to a reaction between indium and boron source gases during the growth of the boron based layer. Further some prior art techniques to re-crystallize the material from a polycrystalline state to a monocrystalline state include annealing, high temperature melting and solidifying. None of these techniques, however, could form epitaxial boron compounds.

The conventional MOCVD process for growing a layer on a substrate requires a thermal heat clean of the substrate to remove the surface oxides. Then, a standard buffer layer, such as a GaAs layer on a GaAs substrate, can be grown at the same growth temperature as the layers grown above it. NREL has followed this process to grow a GaAs buffer layer and BGaAs or BGaInAs test layers above the GaAs layer. Utilizing such a traditional method, NREL could not achieve a preferred composition ($B_{0.093}$ $Ga_{0.707}$ $In_{0.2}$ As, further described below) in the BGaInAs layer to produce an about 1.0 eV bandgap due to crystallization problems in enhancing the boron content as well as the pre-reaction problems associated with the source materials.

U.S. Pat. No. 6,281,426 B1, assigned to Midwest Research Institute, describes utilizing GaInAsN for the third junction in a four junction solar cell in an attempt to provide a bandgap of about 1.0 eV following the traditional growth method described above. Other materials, such as BGaInAs and GaAsGe, were also presented for forming the third junction solar cell. However, because the traditional growth method was utilized, the required composition of BGaInAs material to achieve an about 1.0 eV bandgap was not realized.

As can be seen, there exists a need for an improved multi-junction photovoltaic cell having a 1.0 eV bandgap with requisite properties of single crystal boron compounds without the problems associated with a pre-reaction of source gases and of single crystal formation.

SUMMARY OF THE INVENTION

In one aspect of the present invention, a solar cell comprises a substrate, a nucleation layer disposed above the substrate, a first buffer layer disposed above the nucleation layer, a second buffer layer disposed above the first buffer layer, a first compound layer disposed above the second buffer layer, a second compound layer disposed above the first compound layer, and a window layer disposed above the second compound layer, wherein the first compound layer comprises a first type of doping, wherein the second compound layer comprises a second type of doping, wherein the second buffer layer comprises a higher energy bandgap than the first buffer layer, and wherein the first buffer layer and the second buffer layer permit a boron content in the first compound layer and the second compound layer to be greater than 3%.

In another aspect of the present invention, a photovoltaic cell comprises a nucleation layer disposed above a substrate, a first buffer layer disposed above the nucleation layer, the first buffer layer comprising a primary thickness, a second buffer layer disposed above the first buffer layer, the second buffer layer comprising a secondary thickness thinner than the primary thickness, a first compound layer disposed above the second buffer layer, the first compound layer comprising a first monocrystalline material, and a second compound layer disposed above the first compound layer, the second compound layer comprising a second monocrystalline material, wherein the first compound layer comprises a first type of doping, wherein the second compound layer comprises a second type of doping, wherein the second buffer layer comprises a higher energy bandgap than the first buffer layer, and wherein the first buffer layer and the second buffer layer permit a boron content in the first compound layer and the second compound layer to be about 3% to about 7.6%.

In a further aspect of the present invention, a photovoltaic cell comprises at least one material from a group consisting of a GaAs substrate and a GaAs nucleated Ge substrate, a first buffer layer comprising atomically smooth GaAs and disposed above the substrate, a second buffer layer comprising atomically ordered GaInP$_2$ and disposed above the first buffer layer, a first compound layer disposed above the second buffer layer, and a second compound layer disposed above the first compound layer, wherein the first compound layer and the second compound layer comprise at least one material from a group consisting of BGaAs, BInAs, BGaInAs, BGaAsSb, BGaInP, and BGaPSb.

In yet another aspect of the present invention, a photovoltaic cell comprises a nucleation layer (such as a GaAs nucleation layer) disposed above a substrate (such as a Ge substrate), a first buffer layer disposed above the nucleation layer, a second buffer layer disposed above the first buffer layer, a first solar cell disposed above the second buffer layer, a first window layer disposed above the first solar cell, a first tunnel junction layer disposed above the first window layer, a first back surface field layer disposed above the first tunnel junction layer, a second solar cell disposed above the first back surface field layer, a second window layer disposed above the second solar cell, a second tunnel junction layer disposed above the second window layer, a second back surface field layer disposed above the second tunnel junction layer, a third solar cell disposed above the second back surface field layer, and a third window layer disposed above the third solar cell.

In yet a further aspect of the present invention, a solar cell comprises a Ge substrate material, a Ge solar cell disposed above the substrate material, a boron based solar cell with about a 1.0 eV bandgap disposed above the Ge solar cell, a GaAs solar cell disposed above the boron based solar cell, and a GaInP$_2$ solar cell disposed above the GaAs solar cell.

In yet another aspect of the present invention, a solar cell system adapted to convert photons into electrical current and voltage, comprises at least one solar cell, the solar cell comprising: a GaAs single crystal substrate material, a first buffer layer disposed above the material, the first buffer layer comprising a primary thickness and a first material, and a second buffer layer disposed above the first buffer layer, the second buffer layer comprising a secondary thickness thinner than the primary thickness and a second material, wherein the second buffer layer comprises a higher energy bandgap than the first buffer layer. The solar cell system further comprises a first compound layer disposed above the second buffer layer, the first compound layer comprising a first type of doping and a first single crystalline material, a second compound layer disposed above the first compound layer, the second compound layer comprising a second type of doping and a second single crystalline material, wherein the first compound layer comprises a similar energy bandgap as the second compound layer, wherein either of the compound layers comprise a lower energy bandgap than the first buffer layer, wherein either of the compound layers comprise a lower energy bandgap than the second buffer layer, and a window layer disposed above the second compound layer.

In yet a further aspect of the present invention, a satellite comprises at least one photovoltaic cell adapted to convert photons into electrical current and voltage. The photovoltaic cell comprises a substrate, comprising at least one material from a group consisting of: GaAs and GaAs nucleated Ge, a first buffer layer disposed above the substrate, the first buffer layer comprising a thickness from about 2000 Angstroms to about 1 Micron of a GaAs material and a bandgap width about 1.42 eV, a second buffer layer disposed above the first buffer layer, the second buffer layer comprising a thickness from about 2000 Angstroms to about 5000 Angstroms of a GaInP$_2$ material and a bandgap width about 1.80 eV. The photovoltaic cell further comprises a first compound layer disposed above the second buffer layer, the first compound layer comprising at least one of a first monocrystalline material from a group consisting of: BGaAs, BInAs, BGaInAs, BGaAsSb, BGaInP, and BGaPSb and a bandgap width from about 1.0 eV to about 1.1 eV, and a second compound layer disposed above the first compound layer, the second compound layer comprising at least one of a second monocrystalline material from a group consisting of: BGaAs, BInAs, BGaInAs, BGaAsSb, BGaInP, and BGaPSb and a bandgap width from about 1.0 eV to about 1.1 eV.

In another aspect of the present invention, a method for forming a GaAs buffer layer for use in a solar cell comprises growing the buffer layer at a temperature from about 525° C. to about 575° C., annealing the buffer layer at a temperature from about 580° C. to about 700° C., and cooling the buffer layer at a temperature from about 525° C. to about 575° C.

In yet another aspect of the present invention, a further method for forming a GaAs buffer layer for use in a solar cell comprises growing the buffer layer at a temperature from about 580° C. to about 700° C., cooling the buffer layer at a temperature from about 525° C. to about 575° C., and initiating a growth of a BGaAs layer to the cooled buffer layer.

In a further aspect of the present invention, a method for forming an atomically ordered GaInP$_2$ buffer layer for use in a solar cell comprises introducing tertiary butyl phosphine as a phosphorus source gas to the buffer layer, and growing the buffer layer at a temperature from about 500° C. to about 600° C.

In yet a further aspect of the present invention, a solar cell comprises a substrate, a nucleation layer disposed above the substrate, a first smooth buffer layer disposed above the nucleation layer, a second atomically ordered buffer layer disposed above the first buffer layer, a first compound layer disposed above the second buffer layer, a second compound layer disposed above the first compound layer, and a window layer disposed above the second compound layer, wherein the first smooth buffer layer and the second atomically ordered buffer layer increase an amount of nitrogen capacity in the first compound layer and in the second compound layer.

These and other features, aspects and advantages of the present invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

The present invention generally provides two novel buffer layers prior to the growth of boron-containing compounds such as BGaAs, BGaInAs, and BGaAsSb. One of the buffer layers may be atomically smooth while the other buffer layer may be atomically ordered. An atomically smooth buffer layer can be grown at a first temperature, annealed at a higher temperature, and then cooled at the first temperature, for example. Such an annealing process allows various materials (for example, Ga and As) within the buffer layer to be grown smoothly such that their atomic bonds are properly maintained and contain fewer crystal defects.

An atomically ordered buffer layer allows various materials (for example, Ga, In, and P) within the buffer layer to be grown in an ordered manner. As such, In atoms and P atoms can be paired, Ga atoms and P atoms can then be paired and placed above the In and P pair, and In atoms and P atoms can again be paired and placed above the Ga and P pair. This atomic ordering, which may be complete or partially complete, can continue as needed.

These buffer layers, which may be contained in a solar cell for use with, for example, a satellite, allow a boron content in the boron-containing compounds described above to be increased. Such an increase would provide greater efficiency and power to the solar cell as described further below. Without these two buffer layers, it will be difficult to increase the boron content in those compounds to greater than 3%. Further, a MOVPE growth system has been modified to prevent the pre-reaction of source gases.

Figure 1:
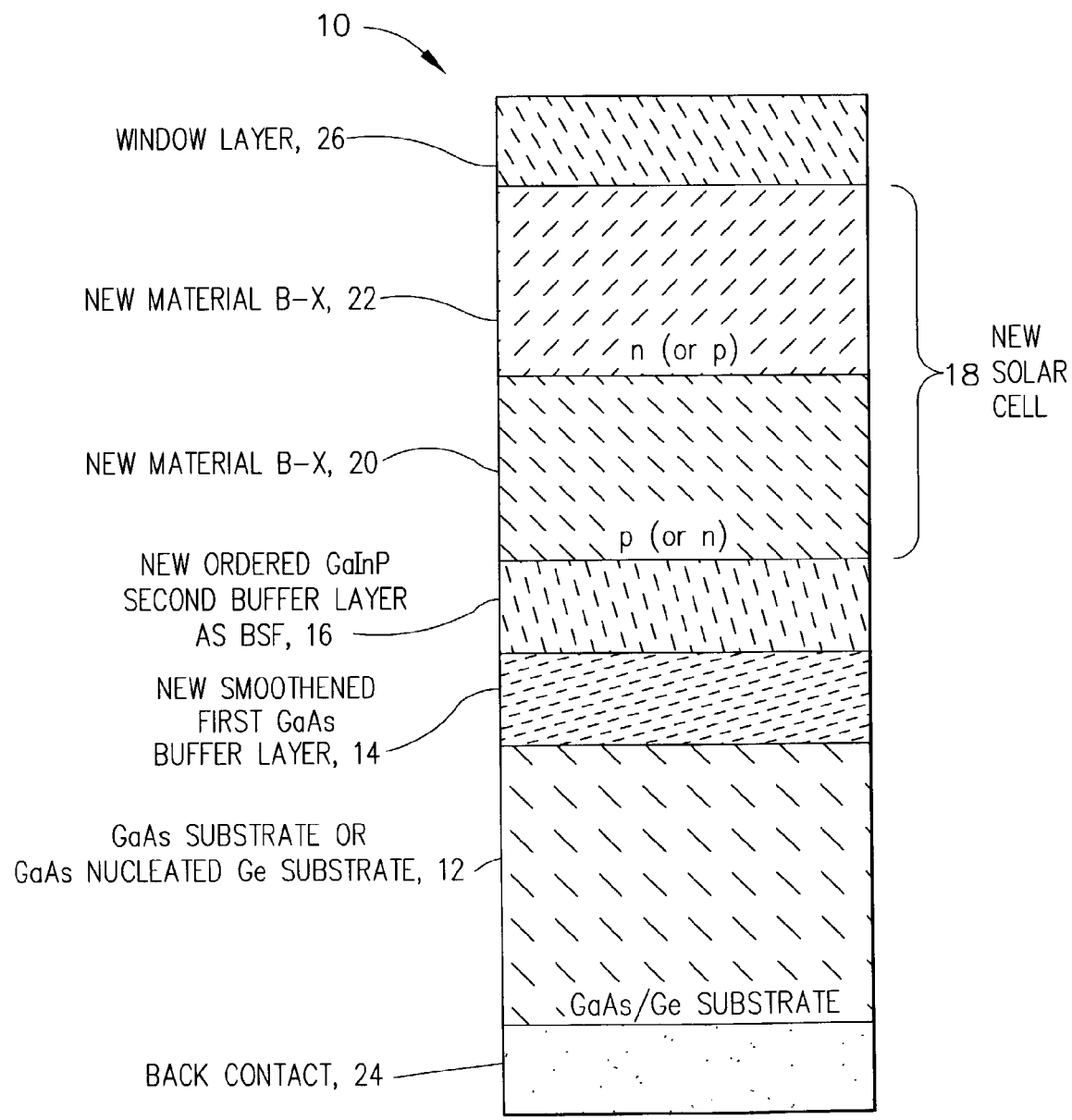
FIG. 1 is a schematic diagram of a solar cell structure using a boron compound layer with a plurality of new buffer layers in accordance with the present invention.

Referring now to FIG. 1, a photovoltaic or solar cell structure 10 is presented. The solar cell structure includes a GaAs substrate 12, a first atomically smoothened GaAs buffer layer 14 disposed above the substrate 12, a second atomically ordered $GaInP_2$ buffer layer 16 disposed above the first buffer layer 14, a solar cell 18 disposed above the second buffer layer 16, a back contact 24 disposed below the substrate, and a window layer 26 disposed above the solar cell 18. The solar cell 18 comprises a boron based first compound layer 20 comprising a single crystal first material and a first type of doping (such as a p-type semiconductor) and a boron based second compound layer 22, disposed above the first compound layer, and comprising a single crystal second material and a second type of doping (such as an n-type semiconductor). The first buffer layer 14 comprises a first material and a primary thickness thicker than the second buffer layer which comprises a second material and a secondary thickness. The second buffer layer 16 comprises a higher energy bandgap than the first compound layer 20 and the second compound layer 22.

In another embodiment, a solar cell 10 comprises a GaAs nucleation layer disposed above a Ge substrate 12, a first buffer layer 14 disposed above the nucleation layer, a second buffer layer 16 disposed above the first buffer layer, a first compound layer 20 (having, for example, a boron compound as a solar cell base layer) disposed above the second buffer layer, a second compound layer 22 (having, for example, a boron compound as a solar cell emitter layer) disposed above the first compound (base) layer, and a window layer 26 disposed above the second compound (emitter) layer, wherein the first compound layer comprises a first type of doping, wherein the second compound layer comprises a second type of doping, and wherein the second buffer layer comprises a higher energy bandgap than the first buffer layer. The first buffer layer may be comprised of atomically smooth GaAs without interstitial defects. Such defects can occur during a deposition of various materials (for example, Ga and As) at incorrect temperatures or speeds. As such, instead of a Ga atom and an As atom located in certain positions, arsenic atoms, for example, may be located in those positions resulting in improper bonding between the materials. The second buffer layer may be comprised of atomically ordered layers (also known as $CuPt_B$ ordering) including successive monolayers of GaP and InP layers to achieve an ordered $GaInP_2$ compound layer.

In a further embodiment, the photovoltaic cell 10 comprises a substrate 12, a nucleation layer disposed above the substrate, a first atomically smooth buffer layer 14 disposed above the nucleation layer, a second atomically ordered buffer layer 16 disposed above the first buffer layer, a first compound layer 20 disposed above the second buffer layer, a second compound layer 22 disposed above the first compound layer, and a window layer 26 disposed above the second compound layer, wherein the first smooth buffer layer and the second atomically ordered buffer layer are used to increase a nitrogen carrying capacity in the first compound layer and in the second compound layer. The first compound layer 20 and the second compound layer 22 comprise at least one material from a group consisting of: gallium, indium, arsenide, and nitride.

In yet another embodiment, the photovoltaic cell 10 comprises a GaAs nucleated Ge substrate 12, a first buffer layer 14 disposed above the GaAs nucleated Ge substrate, the first buffer layer comprising a primary thickness, a second buffer layer 16 disposed above the first buffer layer, the second buffer layer comprising a secondary thickness thinner than the primary thickness, a first compound layer 20 disposed above the second buffer layer, the first compound layer comprising a first monocrystalline material, and a second compound layer 22 disposed above the first compound layer, the second compound layer comprising a second monocrystalline material, wherein the first compound layer comprises a first type of doping, wherein the second compound layer comprises a second type of doping, and wherein the second buffer layer comprises a higher energy bandgap than the first compound layer and the second compound layer. A metal contact 24 and a window layer 26 are disposed, respectively, below the GaAs nucleated Ge substrate 12 and above the second compound layer 22.

The substrate 12 comprises at least one material from a group consisting of: GaAs and GaAs nucleated Ge; the first buffer layer 14 comprises GaAs; the second buffer layer comprises $GaInP_2$; the first monocrystalline material comprises at least one material from a group consisting of: BGaAs, BInAs, BGaInAs, BGaAsSb, BGaInP, and BGaPSb; and the second monocrystalline material comprises at least one material from a group consisting of: BGaAs, BInAs, BGaInAs, BGaAsSb, BGaInP, and BGaPSb. The first monocrystalline material and the second monocrystalline material may be similar if the bandgap widths of the first compound layer 20 and the second compound layer 22 are the same. The first and the second monocrystalline materials can be different, however, if an emitter layer (not shown) has a higher bandgap width than a base layer (not shown) of either of the compound layers 20,22.

The first buffer layer 14 comprises a thickness from about 2000 Angstroms to about 1 Micron and preferably around 5000 Angstroms, while the second buffer layer 16 comprises a thickness from about 2000 Angstroms to about 5000 Angstroms and preferably around 2000 Angstroms to around 2500 Angstroms. The first buffer layer 14 further comprises a bandgap width about 1.40 eV and preferably 1.42 eV, the second buffer layer 16 comprises a bandgap width about 1.80 eV and preferably 1.84 eV, the first compound layer 20 comprises a bandgap width from about 1.0 eV to about 1.1 eV, and the second compound layer 22 comprises a bandgap width from about 1.0 eV to about 1.1 eV.

The first buffer layer 14 may be a specially formed and smoothened GaAs layer which may be utilized to smoothen irregularities on a surface of the substrate 12 (and which may further be quantified via an etch-pit measurement that measures a number of defects on an etched surface). Hence, the importance of optimizing the growth processes for the growth of the buffer layer 14 and during an introduction of smaller atoms such as boron along with bigger atoms (such as arsenic, indium or antimony) in the same lattice (such as BGaAs, BGaInAs or BGaAsSb), should not be understated. A method for forming such a GaAs buffer layer 14 includes growing the buffer layer at a temperature from about 525° C. to about 575° C. for about 15 minutes to about 25 minutes under arsine ambient, annealing the buffer layer at a temperature from about 580° C. to about 700° C., and cooling the buffer layer at a temperature from about 525° C. to about 575° C. A second buffer layer 16 comprising $GaInP_2$ can then be disposed on top of the first buffer layer 14. Boron may further be provided to the cooled buffer layer to commence a growth of either a BGaAs layer or a compound layer.

Another method for forming such a smooth GaAs buffer layer 14 includes growing the buffer layer at a temperature from about 580° C. to about 700° C. and cooling the buffer layer at a temperature from about 525° C. to about 575° C. A second buffer layer 16 comprising GaInP$_2$ can then be disposed on top of the first buffer layer 14. Both of the above methods advantageously prepare the first buffer layer 14 for the subsequent layers to increase the boron content in the resulting compound layers 20 and 22.

The second buffer layer 16 may be an atomically ordered GaInP$_2$ layer using tertiary butyl phosphine (tBP) as a phosphorous source. This lattice matched, high bandgap (about 1.83 eV with respect to BGaAs or BGaInAs layers), atomically ordered GaInP$_2$ layer may be added to the solar cell 10 prior to the growth of and at the same growth temperature as BGaAs or BGaInAs. As such, the enhancement of boron atoms in the lattice structure may be induced.

It has been shown that CuPt$_B$ type ordering occurs in GInP$_2$ when it is grown at relatively lower growth temperatures of about 525° C. to about 575° C. Since atomic ordering is essential for increasing the boron content in the active compound layer, GaInP$_2$ should be grown at a lower temperature as shown above. Doing so restricts the use of source gases that have decomposition temperatures much below the growth temperature. Therefore in order to grow GaInP$_2$ at a lower growth temperature of about 525° C. to about 575° C., tBP can be used as a source gas for phosphorous instead of a conventional source gas such as phosphine (PH$_3$). Using tBP provides advantages since the decomposition temperature of tBP is lower (about 450° C.) than that of the growth temperature of about 550° C. The second buffer layer 16, at a lower growth temperature of about 550° C., exhibits an ordered structure which may enhance the incorporation of boron in the compound. A complete ordering (100%) need not occur. A portion or fraction of that amount is also sufficient to enhance the boron incorporation. The second buffer layer 16 may further act as a back surface field layer which forms an energy barrier to enhance the collection of minority carriers.

A method for forming such a GaInP$_2$ buffer layer 16 includes introducing tBP to the buffer layer and growing the buffer layer at a temperature from about 500° C. to about 600° C. It should be noted that the boron atomic size is smaller than that of other elements in the compound such as Ga, As or Sb since the boron atomic number is 5 and that of Ga, As, and Sb are, respectively, 31, 33, and 51.

Figure 2:
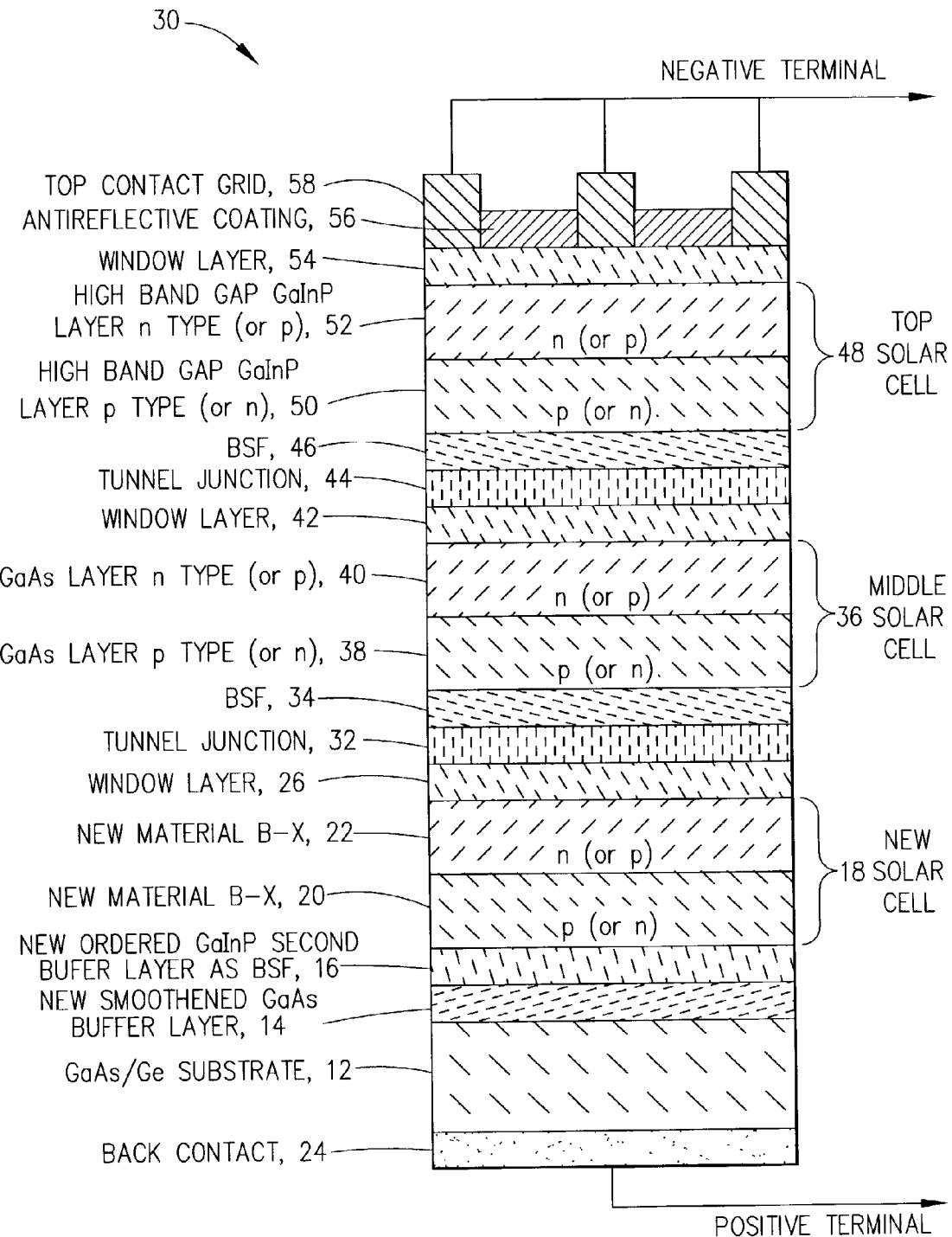
FIG. 2 is a schematic diagram of a triple-junction solar cell structure in accordance with the present invention.

Referring now to FIG. 2, a triple-junction solar cell structure 30 is depicted. The triple-junction solar cell structure 30 includes the solar cell structure 10 as well as a tunnel junction layer 32 disposed above the window layer 26, a back surface field layer 34 disposed above the tunnel junction layer 32, a middle solar cell 36 disposed above the back surface field layer 34, a window layer 42 disposed above the middle solar cell 36, a tunnel junction layer 44 disposed above the window layer 42, a back surface field layer 46 disposed above the tunnel junction layer 44, a top solar cell 48 disposed above the back surface field layer 46, a window layer 54 disposed above the top solar cell 48, an antireflective coating layer 56 disposed above the window layer 54, and a contact layer 58 disposed within the antireflective coating layer 56.

The middle solar cell 36 comprises a GaAs layer comprising a p-type semiconductor 38 and a GaAs layer comprising an n-type semiconductor 40, while the top solar cell 48 comprises a high band gap GaInP$_2$ layer comprising a p-type semiconductor 50 and a high band gap GaInP$_2$ layer comprising an n-type semiconductor 52.

The semiconductor type of each layer of the solar cells 18, 36, and 48 will be opposite the semiconductor type of the closest layer to it. For example, if the layer 20 comprises an n-type semiconductor, then layer 22 comprises a p-type semiconductor, layer 38 comprises an n-type semiconductor, layer 40 comprises a p-type semiconductor, etc. During the material growth n dopants or p dopants are included to form the respective n layers or p layers.

Figure 3:
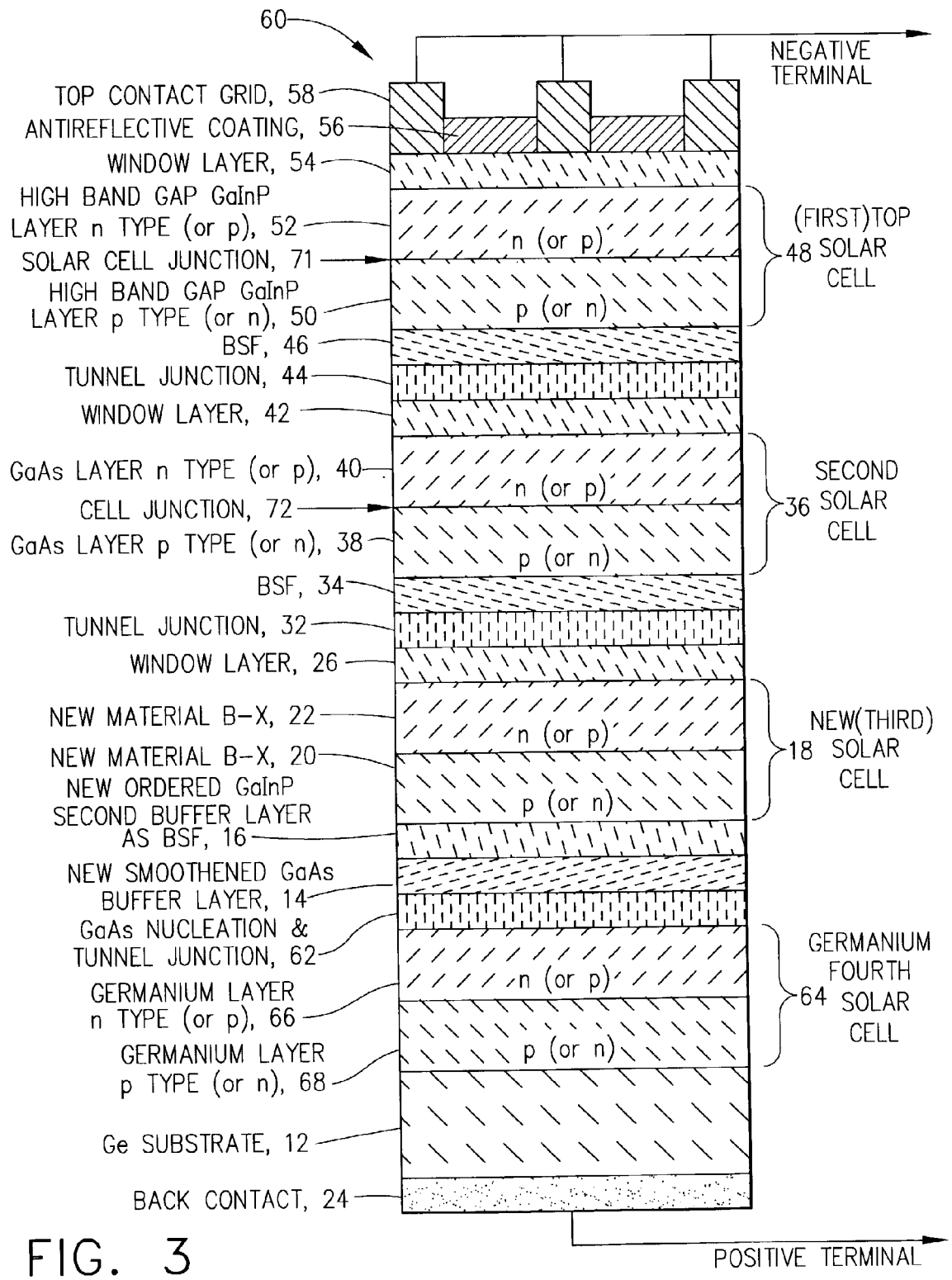
FIG. 3 is a schematic diagram of a quadruple-junction solar cell structure in accordance with the present invention.

Referring now to FIG. 3, a monolithic four-junction solar cell structure 60 is depicted. The four-junction solar cell structure 60 includes the solar cell structure 30 as well as a solar cell 64 (including a Ge layer comprising a p-type semiconductor 68 and a Ge layer comprising an n-type semiconductor 66) disposed above the Ge substrate 12, a GaAs nucleation and tunnel junction 62 disposed above the bottom solar cell 64 and below the first buffer layer 14, a solar cell junction 71 disposed between the layers 50 and 52 of the solar cell 48, and a solar cell junction 72 disposed between the layers 38 and 40 of the solar cell 36.

In one embodiment, the four-junction solar cell 60 comprises a Ge substrate, a Ge solar cell disposed above the Ge substrate, a boron based solar cell with about a 1.0 eV bandgap disposed above the Ge solar cell, a GaAs solar cell disposed above the boron based solar cell, and a GaInP$_2$ solar cell disposed above the GaAs solar cell. In other embodiments, the four-junction solar cell 60 comprises a Ge single crystal substrate, a Ge solar cell disposed above the Ge single crystal substrate, a GaAs nucleation layer disposed above Ge solar cell, a boron based solar cell with about a 1.0 eV bandgap disposed above the GaAs nucleation layer, a GaAs solar cell disposed above the boron based solar cell, and a GaInP$_2$ solar cell disposed above the GaAs solar cell.

The solar cell junctions 71 and 72 are formed by diffusion of corresponding dopant sources during a growth stage. For current conductivity between cells, the tunnel junctions 32, 44, and 62 are provided. Back surface field layers 16, 34, and 46 deflect the carriers towards the p-n junction of that cell. Higher bandgap window layers 26, 42, and 54 reduce the carrier loss due to surface recombination mechanism and also reflect the carriers back to the p-n junction. The antireflective coating 56 effectively collects radiation with minimized reflectance loss, while current from the solar cell stack is tapped from the top and the bottom metal contacts 58 and 24 respectively.

Utilizing the four-junction solar cell 60, the AMO efficiency is above 35% and theoretically calculated to be around 42%. The four solar cell structures grown on the Ge substrate 12 are lattice matched to the Ge substrate. If a layer is grown lattice mismatched, it is well known that introduction of misfit dislocations occurs to reduce the strain energy of the grown layers. These dislocations seriously degrade the performance of the cell 60. New III–V semiconductor compounds such as BInAs, BGaInAs, BGaAsSb, BGaInP and BGaPSb can be utilized with the triple-junction solar cell 30 to achieve an about 1.0 eV bandgap solar cell with the same lattice parameter as that of GaAs nucleated Ge substrates. Currently, a BGaInAs material lattice matched to GaAs nucleated Ge provides a bandgap of about 1.27 eV. Assuming a reasonable band bowing due to these compounds, a composition comprised of about $B_{0.093}Ga_{0.707}In_{0.2}As$, will be needed to have a bandgap of about 1.0 eV and lattice matched to Ge.

Figure 4:
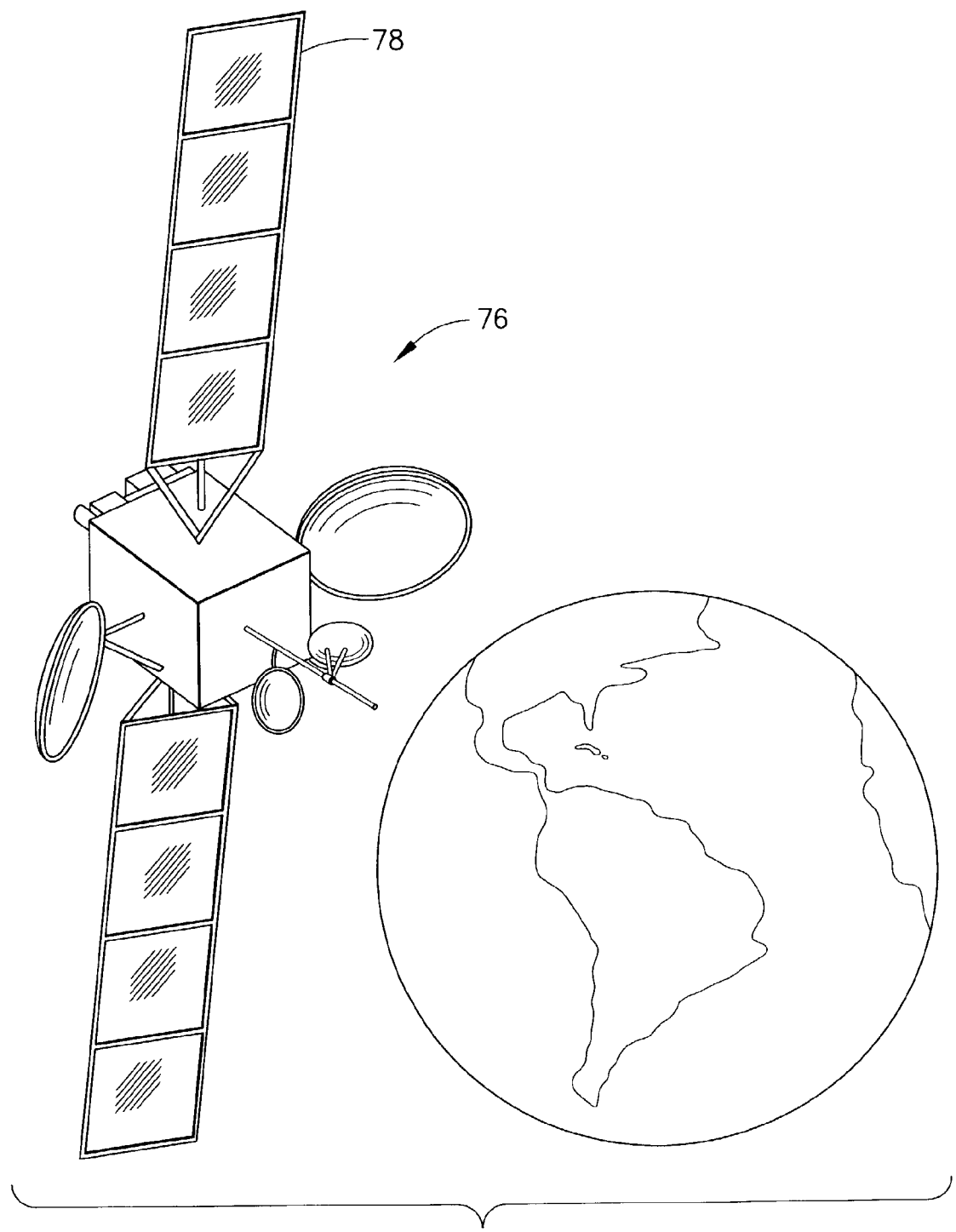
FIG. 4 is a diagram of a satellite comprising a solar array in accordance with the present invention.

Referring now to FIG. 4, a satellite 76 comprises a solar array 78 having at least one photovoltaic cell. The photovoltaic cell may be the photovoltaic cell structure 10, the triple-junction solar cell structure 30, the four-junction solar cell structure 60, a portion of the structures 10, 30, and 60, and may include any of the embodiments described herein.

Figure 5:
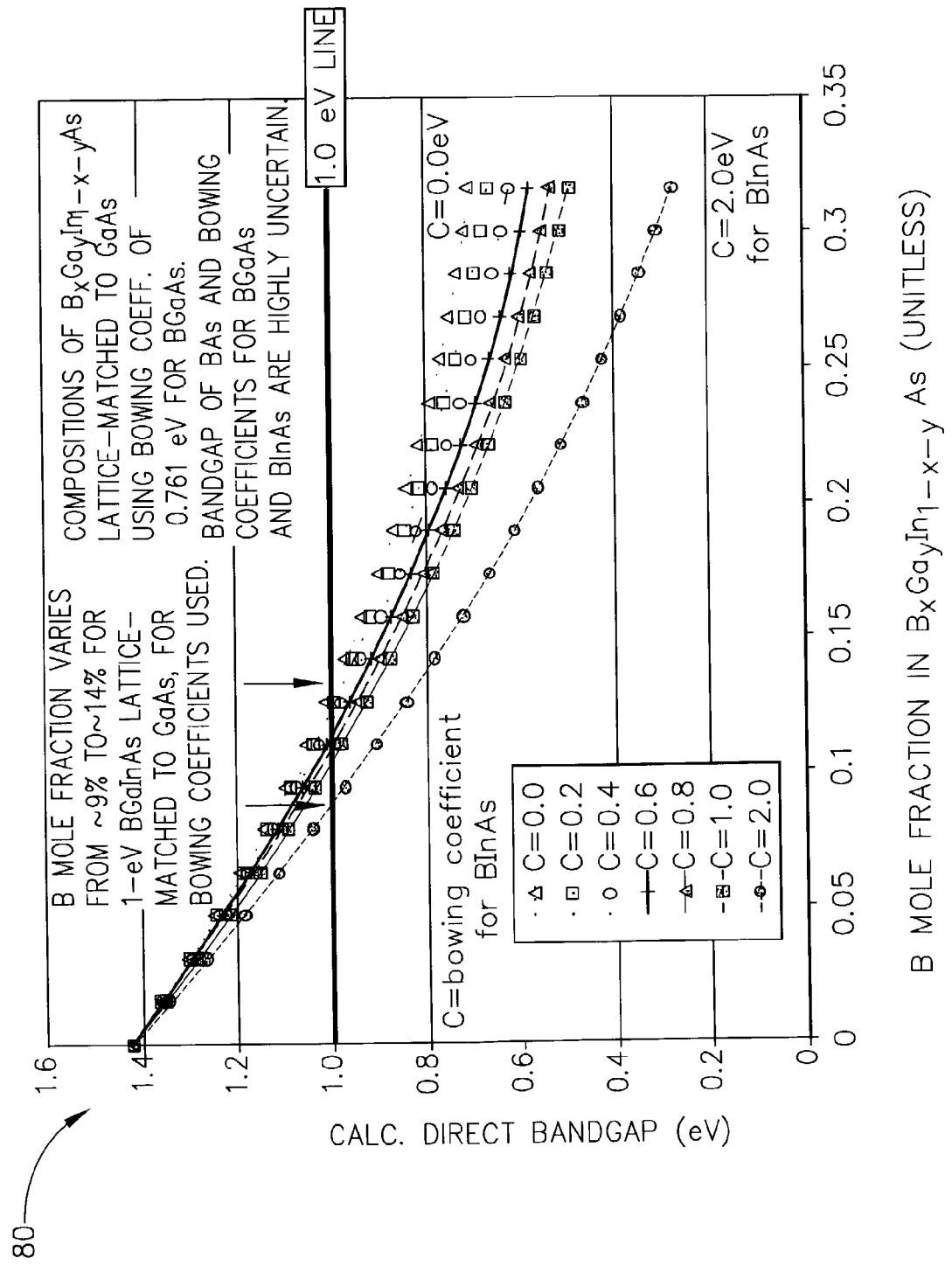
FIG. 5 is a graph depicting a calculated bandgap for various compositions of BGaInAs assuming a reasonable band bowing parameter in accordance with the present invention.

Referring now to FIG. 5, a graph 80 depicts a calculated bandgap for various compositions of BGaInAs that are latticed matched to GaAs assuming a reasonable band bowing parameter variation from 0.0 to 2.0. As can be seen from the graph 80, the boron mole fraction varies from about −9% to about −14% for a 1.0 eV BGaInAs compound lattice matched to GaAs based on the bowing coefficients (C) used. Slight band bowing can be observed but boron provides the compositions with the ability to achieve about a 1.0 eV bandgap.

Thus far, the techniques and processes used for the growth of a new class of III–V semiconductor single crystal epitaxial boron compounds such as BGaAs, BInAs, BGaInAs, BGaAsSb, BGaInP and BGaPSb as well as methods to increase the boron content in those compounds have been described. Utilizing conventional growth techniques, it may be extremely difficult to add boron (even as small as a 0.01 mole fraction of BAs or BP), to the above compounds since the resulting material tends to become polycrystalline. To preserve the single crystalline properties of the above compounds and to increase the boron content in those epitaxial single crystal compounds for any growth technique (such as molecular beam epitaxy, hydride vapor phase epitaxy, liquid phase epitaxy and MOVPE), utilizing the above mentioned buffer layers and avoiding a pre-reaction of the source gases are recommended. With the addition of boron, the ability to tailor the bandgap and the lattice parameter to realize a new class of solar cells, sensors, detectors and electronic devices may be possible.

The described methods for buffer layer preparation and controlled growth parameters such as growth temperature range and excess Group V over pressure range, increase boron incorporation into various compounds. For example, a BAs mole fraction in BGaAs as high as 0.076 has been achieved while still retaining the single crystalline properties of the BGaAs compound grown on a GaAs substrate. Also, a lattice matched BGaInAs material with a bandgap of 1.27 eV has been grown on a GaAs substrate. Further reduction in bandgap is possible with additional boron and indium or antimony added in those compounds as shown in FIG. 5. Using these novel materials, the advantages of the monolithic four-junction solar cell described in FIG. 3 can be realized.

Figure 6:
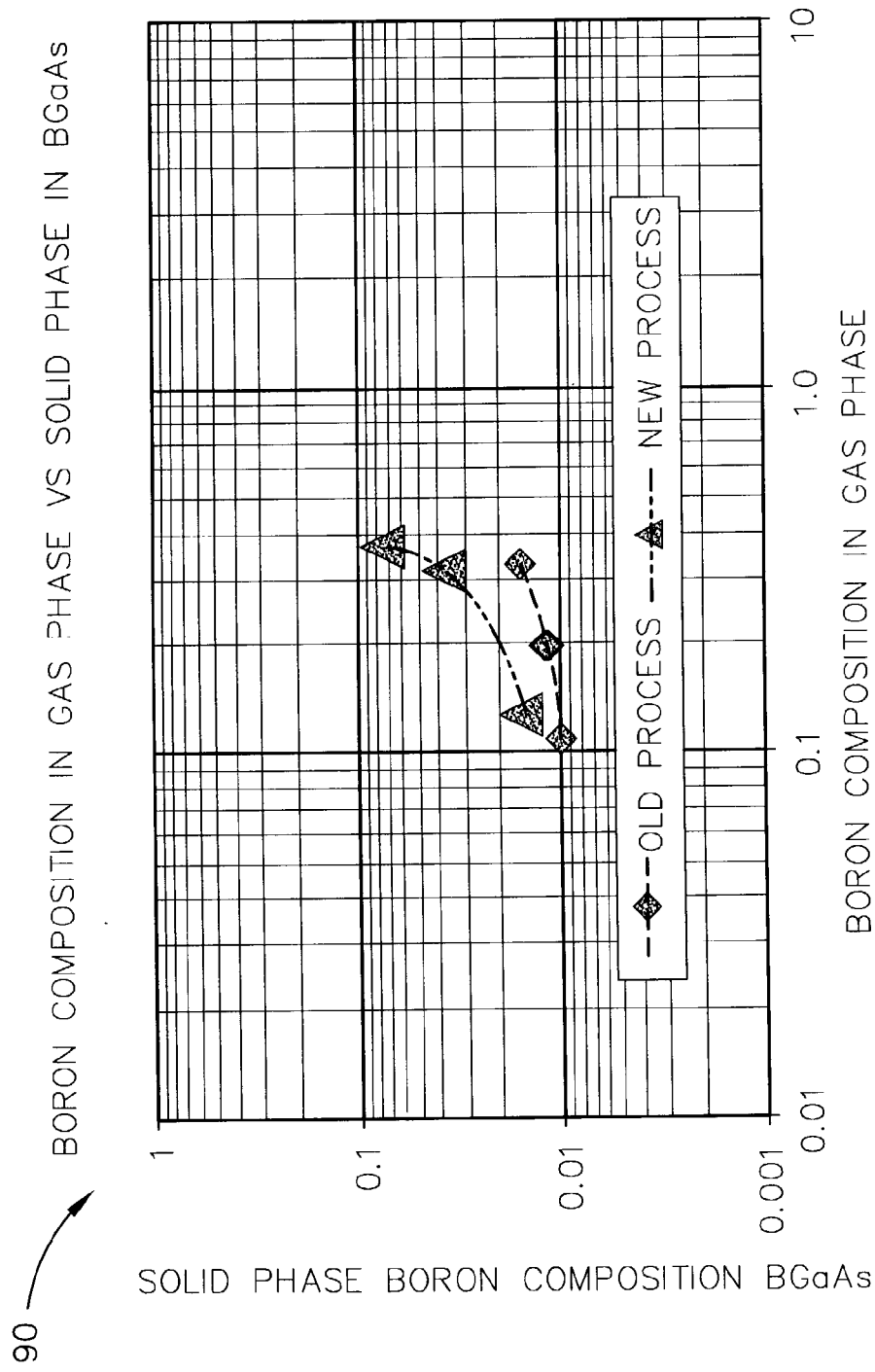
FIG. 6 is a graph depicting a resultant solid phase boron composition against a gas phase boron composition in BGaAs using an old method and a method in accordance with the present invention.

Referring now to FIG. 6, a graph 90 depicts a boron composition in gas phase plotted against a solid boron composition in BGaAs. The boron content in the solid BGaAs can be enhanced using the above mentioned methods for the same amount of boron composition in the input gas phase. As can be seen, the boron incorporation in the solid has been increased from about 0.016-mole fraction of BAs to about 0.076-mole fraction of BAs. Using conventional techniques, it is very difficult to increase the mole fraction meaningfully beyond 0.016. Further, such an increase would result in a polycrystalline material.

A BGaInAs layer lattice matched to GaAs has also been grown. Triethyl Indium (TEIn) was used as the indium source since the conventional Trimethyl Indium (TMIn) source reacts with either diborane or Triethyl Boron (TEB) source gases. With TEIn however, no pre-reaction with TEB or diborane is observed. Traditionally, the TMIn source was preferred since it has a higher vapor pressure, 1.73 Torr at 20° C. at atmospheric bubbler pressure, compared with 0.21 Torr for TEIn under the same conditions. However, it can be relatively easy to transport the vapor to a reaction chamber in a MOVPE system. For compounds of interest to this invention, only about a 20% indium content may be needed. As such, a traditional approach of bubbling hydrogen through a bubbler to transport the required amount of vapor to the growth chamber may be followed. Using a TEIn source and a TEB source, mirror smooth layers can be obtained.

As can be appreciated by those skilled in the art, the present invention provides methods for growing novel boron compounds for applications toward optical and electronic devices, such as multiple-junction solar cells, where the conversion efficiency and power are increased. A low pressure MOVPE system allows the growth of a special buffer layer 14 used to grow epitaxial single crystal boron compounds, and a special buffer layer 16 to enhance the boron incorporation. A boron content of about 7.6% has been demonstrated in those compounds in addition to an increase in the boron mole fraction to at least 0.1 without sacrificing the single crystal properties.

The present invention allows the growth of compound materials, such as BGaAsSb, BGaInP, and BGaPSb, lattice matched to GaAs or Ge. By varying the mole fractions of Boron Arsenide, Gallium Arsenide and Indium Arsenide, a series of materials with bandgaps less than that of GaAs can be achieved. This provides an ability to tailor the material for devices of discreet or varying bandgaps. For example, 980 nm pump lasers are currently fabricated using lattice-mismatched layers. Using the aforementioned novel materials, lattice matched materials for such pump lasers can be grown. Low bandgap p-high electron mobility transistor (p-HEMT) devices can also be fabricated using the above materials. Presently, lattice-mismatched InGaAs can be grown on GaAs to process p-HEMT devices. The present invention will allow the growth of lattice matched BGaInAs or BGaAsSb materials on GaAs with the required bandgap for p-HEMT devices. Since the material can be lattice matched, device performance increases over the present lattice mismatched materials.

It should be understood, of course, that the foregoing relates to preferred embodiments of the invention and that modifications may be made without departing from the spirit and scope of the invention as set forth in the following claims.

We claim:

1. A solar cell, comprising:
   a first buffer layer, wherein the first buffer layer is atomically smooth;
   a second buffer layer disposed above the first buffer layer, wherein the second buffer layer is atomically ordered according to $CuPt_B$ ordering;
   a first compound layer disposed above the second buffer layer; and
   a second compound layer disposed above the first compound layer;
   wherein the first compound layer and the second compound layer have a boron content of at least 7.6 mole %.

2. The solar cell of claim 1, wherein the first compound layer comprises a similar energy bandgap as the second compound layer.

3. The solar cell of claim 1, wherein the second buffer layer comprises a secondary thickness, and wherein the first buffer layer comprises a primary thickness thicker than the secondary thickness.

4. The solar cell of claim 1, wherein the first buffer layer comprises a first material.

5. The solar cell of claim 1, wherein the second buffer layer comprises a second material.

6. The solar cell of claim 1, wherein the first compound layer comprises a first material.

7. The solar cell of claim 6, wherein the first material comprises a single crystal.

8. The solar cell of claim 1, wherein the second compound layer comprises a second material.

9. The solar cell of claim 8, wherein the second material comprises a single crystal.

10. A photovoltaic cell, comprising:
a substrate;
a nucleation layer disposed above the substrate;
a first buffer layer disposed above the nucleation layer, the first buffer layer comprising a primary thickness, and the first buffer layer being an atomically smooth layer;
a second buffer layer disposed above the first buffer layer, the second buffer layer comprising a secondary thickness thinner than the primary thickness, and the second buffer layer being atomically ordered according to $CuPt_B$ ordering;
a first compound layer disposed above the second buffer layer, the first compound layer comprising a first monocrystalline material; and
a second compound layer disposed above the first compound layer, the second compound layer comprising a second monocrystalline material;
wherein the first compound layer comprises a first type of doping;
wherein the second compound layer comprises a second type of doping;
wherein the second buffer layer comprises a higher energy bandgap than the first buffer layer; and
wherein the first compound layer and the second compound layer have a boron content of at least 7.6 mole %.

11. The photovoltaic cell of claim 10 further comprising a window layer disposed above the second compound layer.

12. The photovoltaic cell of claim 10 further comprising a metal contact disposed below the substrate.

13. The photovoltaic cell of claim 10, wherein the substrate comprises at least one material selected from the group consisting of: GaAs and GaAs nucleated Ge.

14. The photovoltaic cell of claim 10, wherein the first buffer layer comprises GaAs.

15. The photovoltaic cell of claim 10, wherein the second buffer layer comprises successive monolayers of GaP and InP that achieve a $CuPt_B$ atomically ordered $GaInP_2$ compound layer.

16. The photovoltaic cell of claim 10, wherein the first monocrystalline material comprises at least one material selected from the group consisting of: BGaAs, BInAs, BGaInAs, BGaAsSb, BGaInP, and BGaPSb.

17. The photovoltaic cell of claim 10, wherein the second monocrystalline material comprises at least one material selected from the group consisting of: BGaAs, BInAs, BGaInAs, BGaAsSb, BGaInP, and BGaPSb.

18. The photovoltaic cell of claim 10, wherein the first monocrystalline material and the second monocrystalline material are similar.

19. The photovoltaic cell of claim 10, wherein the first monocrystalline material and the second monocrystalline material are different.

20. The photovoltaic cell of claim 10, wherein the first buffer layer comprises a thickness from about 2000 Angstroms to about 1 micron.

21. The photovoltaic cell of claim 10, wherein the second buffer layer comprises a thickness from about 2000 Angstroms to about 5000 Angstroms.

22. The photovoltaic cell of claim 10, wherein the first buffer layer comprises a bandgap width about 1.42 eV.

23. The photovoltaic cell of claim 10, wherein the second buffer layer comprises a bandgap width about 1.83 eV.

24. The photovoltaic cell of claim 10, wherein the first compound layer comprises a bandgap width from about 1.0 eV to about 1.1 eV.

25. The photovoltaic cell of claim 10, wherein the second compound layer comprises a bandgap width from about 1.0 eV to about 1.1 eV.

26. A photovoltaic cell, comprising:
a substrate comprising at least one material selected from the group consisting of GaAs and GaAs nucleated Ge;
a first buffer layer comprising atomically smooth GaAs and disposed above the substrate;
a second buffer layer comprising $CuPt_B$ atomically ordered $GaInP_2$ and disposed above the first buffer layer, the atomically ordered second buffer layer including successive monolayers of GaP and InP;
a first compound layer disposed above the second buffer layer; and
a second compound layer disposed above the first compound layer;
wherein the first compound layer and the second compound layer comprise at least one material selected from the group consisting of: BGaAs, BInAs, BGaInAs, BGaAsSb, BGaInP, and BGaPSb, and wherein the first and the second compound layer have a boron content of at least 7.6 mole %, and wherein the first and the second compound layer have a bandgap width from about 1.0 eV to about 1.1 eV.

27. A solar cell, comprising:
a substrate;
a nucleation layer disposed above the substrate;
an atomically smooth first buffer layer disposed above the nucleation layer;
an atomically ordered second buffer layer disposed above the first buffer layer, wherein the second buffer layer includes successive monolayers of GaP and InP forming an $CuPt_B$ atomically ordered $GaInP_2$ compound layer;
a first solar cell disposed above the second buffer layer, wherein said first solar cell is manufactured from monocrystalline materials containing at least 7.6 mole % boron;
a first window layer disposed above the first solar cell;
a first tunnel junction layer disposed above the first window layer;
a first back surface field layer disposed above the first tunnel junction layer;
a second solar cell disposed above the first back surface field layer;
a second window layer disposed above the second solar cell;
a second tunnel junction layer disposed above the second window layer;
a second back surface field layer disposed above the second tunnel junction layer;
a third solar cell disposed above the second back surface field layer; and
a third window layer disposed above the third solar cell.

28. The solar cell of claim 27 further comprising a contact disposed below the substrate.

29. The solar cell of claim 27 further comprising an anti reflective coating layer disposed above the third window layer.

30. The solar cell of claim 29 further comprising a contact layer disposed above the antireflective coating layer.

31. The solar cell of claim 27, wherein the first solar cell comprises at least one material selected from the group consisting of: BGaAs, BInAs, BGaInAs, BGaAsSb, BGaInP, and BGaPSb.

32. The solar cell of claim 27, wherein the second solar cell comprises GaAs.

33. The solar cell of claim 27, wherein the third solar cell comprises $GaInP_2$.

34. A solar cell, comprising:
a Ge substrate material;
a Ge solar cell disposed above the Ge substrate material;
a boron based solar cell with about a 1.0 eV to about 1.1 eV bandgap disposed above the Ge solar cell, the boron based solar cell containing at least 7.6 mole % boron;
a GaAs solar cell disposed above the boron based solar cell; and
a $GaInP_2$ solar cell disposed above the GaAs solar cell.

35. A solar cell, comprising:
a Ge substrate;
a GaAs nucleation layer disposed above the substrate;
a first atomically smooth GaAs buffer layer disposed above the nucleation layer, the first buffer layer being free of interstitial defects, the first buffer layer grown at a temperature from about 525° C. to about 575° C., subsequently annealed at a temperature from about 580° C. to about 700° C., and subsequently cooled at a temperature from about 525° C. to about 575° C.;
a second atomically ordered buffer layer disposed above the first buffer layer, the second buffer layer including successive monolayers of GaP and InP forming an $CuPt_B$ ordered $GaInP_2$ compound layer;
a first compound layer disposed above the second buffer layer, the first compound layer including a boron compound with a boron content of at least 7.6 mole % as a solar cell base layer;
a second compound layer disposed above the first compound layer, the second compound layer including a boron compound with a boron content of at least 7.6 mole % as a solar cell emitter layer; and
a window layer disposed above the second compound layer;
wherein the first compound layer comprises a first type of doping, wherein the second compound layer comprises a second type of doping, wherein the first compound layer and the second compound layer both comprise a bandgap width from about 1.0 eV to 1.1 eV; and
wherein said second buffer layer comprises a higher energy bandgap than the first buffer layer.

36. The solar cell of claim 35, wherein the first compound layer and the second compound layer comprise at least one material selected from the group consisting of Gallium, Indium, Arsenide, Phosphorous, Antimony, and Boron.

37. A solar cell system, comprising:
a solar array having at least one solar cell, the solar cell comprising:
a GaAs single crystal substrate material;
a first buffer layer disposed above the GaAs single crystal substrate material, the first buffer layer comprising:
a primary thickness; and
a first material, the first material being atomically smooth;
a second buffer layer disposed above the first buffer layer, the second buffer layer comprising:
a secondary thickness thinner than the primary thickness; and
a second material, the second material being atomically ordered;
wherein the second buffer layer comprises a higher energy bandgap than the first compound layer;
a first compound layer disposed above the second buffer layer, the first compound layer comprising:
a first type of doping; and
a first single crystalline material having a boron content of at least 7.6 mole %;
a second compound layer disposed above the first compound layer, the second compound layer comprising:
a second type of doping; and
a second single crystalline material having a boron content of at least 7.6 mole %;
wherein the first compound layer comprises a similar energy bandgap as the second compound layer, the bandgap being about 1 eV;
wherein either of the compound layers comprise a lower energy bandgap than the first buffer layer;
wherein either of the compound layers comprise a lower energy bandgap than the second buffer layer; and
a window layer disposed above the second compound layer.

38. A satellite system, comprising:
a satellite;
a solar cell array having at least one photovoltaic cell comprising:
a substrate comprising at least one material selected from the group consisting of: GaAs and GaAs nucleated Ge;
a first buffer layer disposed above the substrate, the first buffer layer being atomically smooth and comprising:
a thickness from about 2000 Angstroms to about 1 micron of a GaAs material; and
a bandgap width about 1.40 eV;
an atomically ordered second buffer layer disposed above the first buffer layer, the second buffer layer comprising:
successive monolayers of GaP and InP forming an $CuPt_B$ atomically ordered $GaInP_2$ compound layer, the $GaInP_2$ compound layer grown at a temperature between about 525° C. to about 575° C. using tertiary butyl phosphine as source gas;
a thickness from about 2000 Angstroms to about 5000 Angstroms of a $GaInP_2$ material; and
a bandgap width about 1.83 eV;
a first compound layer disposed above the second buffer layer, the first compound layer comprising:
at least one of a first monocrystalline material selected from the group consisting of: BGaAs, BInAs, BGaInAs, BGaAsSb, BGaInP, and BGaPSb, the material having a boron content of at least 7.6 mole %; and
a bandgap width from about 1.0 eV to about 1.1 eV; and
a second compound layer disposed above the first compound layer, the second compound layer comprising:
at least one of a second monocrystalline material selected from the group consisting of: BGaAs, BInAs, BGaInAs, BGaAsSb, BGaInP, and BGaPSb, the material having a boron content of at least 7.6 mole %; and a bandgap width from about 1.0 eV to about 1.1 eV.

* * * * *